(12) United States Patent
Haiyang et al.

(10) Patent No.: US 8,835,325 B2
(45) Date of Patent: Sep. 16, 2014

(54) METHOD FOR MANUFACTURING A SEMICONDUCTOR DEVICE

(75) Inventors: Zhang Haiyang, Beijing (CN); Minda Hu, Beijing (CN)

(73) Assignee: Semiconductor Manufacturing International (Beijing) Corporation, Beijing (CN)

( * ) Notice: Subject to any disclaimer, the term of this patent is extended or adjusted under 35 U.S.C. 154(b) by 0 days.

(21) Appl. No.: 13/323,728

(22) Filed: Dec. 12, 2011

(65) Prior Publication Data

US 2013/0034964 A1 Feb. 7, 2013

(30) Foreign Application Priority Data

Aug. 2, 2011 (CN) .......................... 2011 1 0218931

(51) Int. Cl.
*H01L 21/311* (2006.01)
*H01L 21/3205* (2006.01)
*H01L 21/027* (2006.01)
*H01L 21/033* (2006.01)

(52) U.S. Cl.
CPC ...... *H01L 21/0276* (2013.01); *H01L 21/32051* (2013.01); *H01L 21/0337* (2013.01); *H01L 21/31144* (2013.01)
USPC .......................................................... 438/702

(58) Field of Classification Search
None
See application file for complete search history.

(56) References Cited

U.S. PATENT DOCUMENTS

| | | | |
|---|---|---|---|
| 2006/0124467 A1 | 6/2006 | Ho et al. | |
| 2008/0193658 A1 | 8/2008 | Millward | |
| 2010/0167214 A1* | 7/2010 | Yoon et al. | 430/323 |
| 2011/0250745 A1* | 10/2011 | Millward et al. | 438/591 |

FOREIGN PATENT DOCUMENTS

CN 101837950 9/2010

OTHER PUBLICATIONS

Morkved, T.L.; Wiltzius, P.; Jaeger, H.M.; Grier, D.G.; Witten, T. A., "Mesoscopic self- assembly of gold islands on diblock-copolymer films," Applied Physics Letters, vol. 64, No. 4, pp. 422,424, Jan. 1994.*
Choi JH; Adams SM; Ragan R., "Design of a versatile chemical assembly method for patterning colloidal nanoparticles," Nanotechnology. Feb. 11, 2009;20.*
W. A. Lopes; H. M. Jaeger, "Hierarchical self-assembly of metal nanostructures on diblock copolymer scaffolds" Nature. Dec. 13, 2001; 414(6865).*
Danilo Zschech et al., "High-temperature resistant, ordered gold nanoparticle arrays" Nanotechnology. 2006 vol. 17 No. 9 2122.*

(Continued)

*Primary Examiner* — Mark Tornow
*Assistant Examiner* — Priya Rampersaud
(74) *Attorney, Agent, or Firm* — Koppel, Patrick, Heybl & Philpott; Michael J. Ram

(57) ABSTRACT

The present invention discloses a method of manufacturing a semiconductor device. In order to form a trench with a smaller width, patterns of various monomers are formed by utilizing self-assembly characteristics of a block copolymer comprising various monomers. A metal or metal nitride is deposited on a surface of the block copolymer, the metal or metallic nitride selectively depositing due to a preferential chemical affinity between various monomers and the metal or metal nitride. After reaching a certain thickness, the metal or metal nitride layer begins to grow laterally. Deposition can be stopped by controlling deposition time so that the metal or metal nitride layer grows laterally but does not completely cover the surface of the block copolymer. Etching is then conducted using the metal or metal nitride layer as a mask to obtain a trench with a very small width.

16 Claims, 5 Drawing Sheets

(56) References Cited

OTHER PUBLICATIONS

"Process Simulation of Block Copolymer Lithography", by Sang-Kon Kim, Proceedings of 10$^{th}$ IEEE International conference on Nanotechnology Joint Symposium with Nano Korea 2010.

"Selective Doping of Block Copolymers Nanodomains by sputter Deposition of Iron", by Mottakin M. Abul Kashem, et al., Macromolecules 2011, ACS Publishers, 2011 American Chemical Society, Feb. 14, 2011, pp. 1621-1627.

"Plasma etch removal of poly(methyl methacrylate) in block copolymer lithography", by Yuk-Hong Ting, et al., J. Vac. Sci. Technol. B 26(5), Sep./Oct. 2008, pp. 1684-1689.

First Office Action from corresponding Chinese Patent Appl. No. 201110218931.5. dated Jul. 30. 2014.

\* cited by examiner

METHOD FOR MANUFACTURING A SEMICONDUCTOR DEVICE

CROSS-REFERENCE TO RELATED APPLICATIONS

This application claims priority to Chinese Patent Application No. 201110218931.5, filed on Aug. 2, 2011 and entitled "Method for Manufacturing a Semiconductor Device", which is incorporated herein in its entirety by reference.

FIELD OF THE INVENTION

The present invention relates to the field of semiconductor fabrication techniques, and more specifically, relates to a method for manufacturing semiconductor devices.

DESCRIPTION OF THE RELATED ART

With the development of semiconductor techniques, the critical dimensions for a semiconductor device have significantly shrunk. Efforts have been made for seeking a method that is capable of further reducing a linear domain width and a trench width of a semiconductor device.

S. Kim discloses a method of forming a trench in a self-assembly manner (see, "Process Simulation of Block Copolymer Lithography", Proceedings of $10^{th}$ IEEE International Conference on Nanotechnology Joint Symposium with Nano Korea 2010). In this method, a self-assembly process is directed by graphoepitaxy or by using a chemical surface pattern. By means of annealing, polystyrene (PS) monomer and poly (methyl methacrylate) (PMMA) monomer in polystyrene-block-poly (methyl methacrylate) copolymers (PS-b-PMMA) are separated, and thus PS and PMMA monomer linear domains are formed on a substrate. These two kinds of monomer linear domains are separated from each other, and the PMMA linear domains are selectively removed with acetic acid under ultra-violet light irradiation, thereby forming trenches on the substrate.

Mottakin discloses a method for preparing a metal coating (see, "Selective Doping of Block Copolymer Nanodomains by Sputter Deposition of Iron", Macromolecules, February 2011). Mottakin has discovered that, when depositing a metal iron on a PS-b-PMMA copolymer thin film where the PS monomer and the PMMA monomer have already been separated from each other, iron atoms selectively deposit on the PMMA domains due to the preferential chemical affinity. When the thickness of the iron layer on the PMMA domains exceeds 2.0 nm, the iron layer begins to grow laterally and finally covers the entire surface of the PS-b-PMMA copolymer thin film.

SUMMARY OF THE INVENTION

In a semiconductor device manufactured using the aforementioned method, the width of a trench is typically from 10 nm to 1000 nm, which obviously cannot meet the critical dimension requirement with regard to the current development of semiconductor techniques.

The inventor of the present invention has found that there are some problems in the prior art and thus proposes a new technical solution to address at least one of the problems.

One object of the present invention is to provide a technical solution for manufacturing a semiconductor device.

According to a first aspect of the present invention, there is provided a method of manufacturing a semiconductor device, which comprises the steps of performing a self-assembly process to form a coating of block copolymer that is copolymerized by two or more types of monomers, such that at least one monomer in the block copolymer is self-assembled so as to form a pattern for the at least one monomer, depositing a metal or a metallic nitride coating on a surface of the block copolymer, until the deposited metal or metallic nitride coating begins to grow laterally but not yet completely covers a surface of the block copolymer and etching, by using the deposited metal or metallic nitride coating as a mask to remove a portion of the block copolymer that is not covered by the metal or metallic nitride coating, thereby forming a trench.

Preferably, the block copolymer can be a diblock copolymer or a tri-block copolymer. For example, the diblock copolymer can be a polystyrene-block-poly (methyl methacrylate) copolymer and the tri-block copolymer can be a polyoxyethylene-polyoxypropylene-polyoxyethylene tri-block copolymer.

Preferably, a width of the pattern for the at least one monomer can be controlled by adjusting a mass ratio of each monomer in the block copolymer. For example, in the polystyrene-block-poly (methyl methacrylate) (i.e., PS-b-PMMA) copolymer, a mass ratio of the polystyrene monomer and the poly (methyl methacrylate) monomer can be from 10:1 to 1:10.

Preferably, the self-assembly processing can be solvent fumigation or annealing.

Preferably, the metal can be iron, tantalum, or titanium, and the metallic nitride can be titanium nitride or tantalum nitride.

Preferably, the etching can be a dry etching, and further, the gas used in the dry etching can comprise $Ar$, $O_2$, $CF_4$ and $CHF_3$.

Preferably, the metal or metallic nitride coating can be deposited by sputtering, chemical vapour deposition or electron beam evaporation, wherein the sputtering can be, for example, direct current sputtering, alternative current sputtering, reactive sputtering, magnetron sputtering or the like.

Preferably, a time for depositing the metal or metallic nitride coating can be selected based on factors like monomer category, surface affinity and the thickness to be formed. Or, a time for depositing the metal or metallic nitride coating can be set to a predetermined value.

Preferably, the pattern for the monomer can be a linear pattern or a ring-shaped pattern.

Preferably, the block copolymer coating can be provided on a semiconductor substrate.

One advantage of the present invention is the ability to provide a semiconductor device with a trench with a smaller width.

Further features of the present invention and advantages thereof will become apparent from the following detailed description of exemplary embodiments with reference to the accompanying drawings.

BRIEF DESCRIPTION OF THE DRAWINGS

With reference to the accompanying drawings, the present invention can be more clearly understood based on the following detailed description, in which.

DESCRIPTION OF THE EMBODIMENTS

Figure 1:
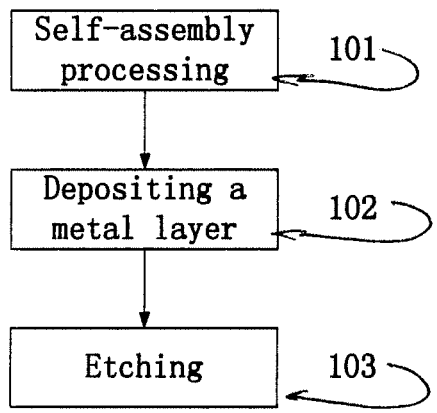
FIG. 1 is a flowchart showing a method of forming a trench according to an embodiment of the present invention.

Various exemplary embodiments of the present invention will now be described in detail with reference to the drawings. The relative arrangement of the components and steps, the numerical expressions and numerical values set forth in these embodiments are not intended to limit the scope of the present invention unless it is specifically stated otherwise.

It should also be understood that, for the convenience of description, components shown in the figures have not been necessarily drawn to scale.

The following description of at least one exemplary embodiment is merely illustrative in nature and is in no way intended to limit the invention, its application, or uses.

Techniques, methods and apparatus as known by one of ordinary skill in the relevant art may not be discussed in detail but are intended to be part of the specification where appropriate.

In all of the examples illustrated and discussed herein, any specific values should be interpreted to be illustrative only and non-limiting. Thus, other examples of the exemplary embodiments could have different values.

Similar reference numerals and letters refer to similar items in the following figures, and thus once an item is defined in one figure, it is possible that it need not be further discussed for following figures.

FIG. 1 schematically shows a flowchart for a method of forming a plurality of trenches during the process of manufacturing a semiconductor device according to an embodiment of the present invention.

First, a self-assembly processing is performed for coating of a block copolymer that is copolymerized by two or more types of monomers, such that at least one monomer in the block copolymer is separated. Thereby a pattern for the at least one monomer is formed (Step 101).

Then, a metal coating is deposited on a surface of the block copolymer until the deposited metal coating begins to grow laterally but does not yet completely cover the surface of the block copolymer (Step 102).

Finally, etching is conducted by using the deposited metal coating as a mask to remove the portion of the block copolymer that has not been covered by the metal coating, thereby forming a trench (Step 103).

In the above method, the block copolymer has the following characteristics. By means of, for example, solvent fumigation or annealing, one or more monomers in the block copolymer can be separated and a pattern for a monomer can be formed. Such a block copolymer can be, for example, a diblock copolymer that is composed of two monomers or a tri-block copolymer that is composed of three monomers.

As for the diblock copolymer material, a typical example is polystyrene-block-poly (methyl methacrylate) (PS-b-PMMA) copolymer.

As for the tri-block copolymer material, a typical example is polyoxyethylene-polyoxypropylene-polyoxyethylene tri-block copolymer.

FIGS. 2a-2d and FIGS. 3a-3f illustrate forming linear patterns for the PS monomer and the PMMA monomer on the substrate (i.e., a pattern for the monomers). FIGS. 2a-2d shows the formation of a linear pattern for the monomers by graphoepitaxy, and FIGS. 3a-3f shows the formation of a linear pattern for the monomers by fabricating a chemically nano-patterned surface.

Figure 2A:
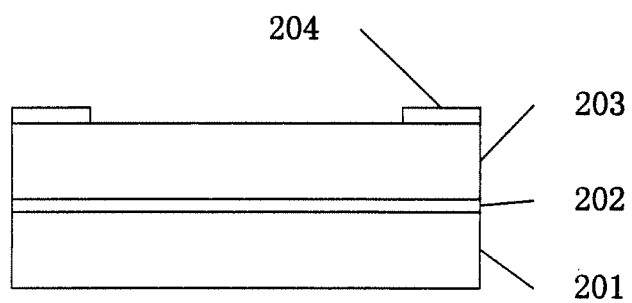
FIGS. 2a-2d are diagrams showing a first embodiment for the formation of monomer patterns using block copolymers.

As shown in FIG. 2a, a photo-resist layer 203 is spin-coated on a substrate 201 having an anti-reflective layer/copolymer brush (ARC/ps brush) layer 202. A mask plate 204 is applied and then the photo-resist layer 203 is subjected to exposure. Only a portion of the photo-resist layer 203 is exposed under the protection of a mask plate 204.

Figure 2B:
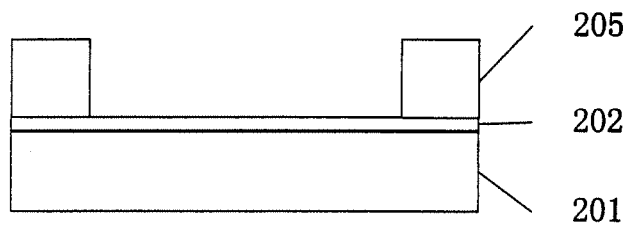

Then, the photo-resist 203 is subjected to development to remove the exposed photo-resist, with only the photo-resist 205 at two sides being left, as shown in FIG. 2b.

Figure 2C:
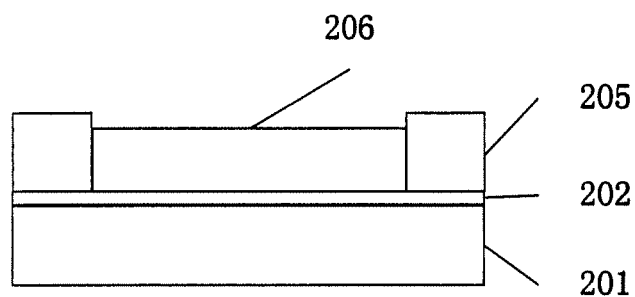

Next, as shown in FIG. 2c, a layer of PS-b-PMMA is deposited in a space between the two photo-resist 205 portions.

Figure 2D:
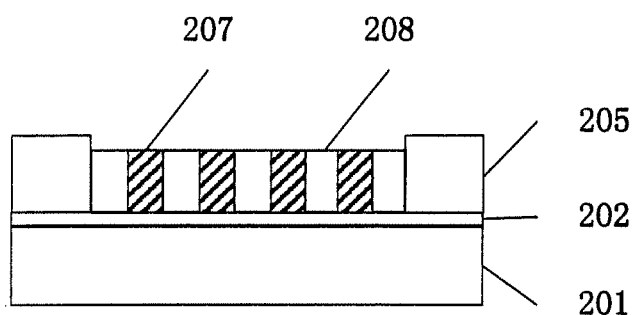

Then, the PS-b-PMMA is subjected to annealing such that the PS monomer and the PMMA monomer are separated. Thus, PS monomer linear domains 207 and PMMA monomer linear domains 208 that are alternated is formed as shown in FIG. 2d. In this way, a directed self-assembly process for the PS-b-PMMA copolymer is achieved. The orientations of the PS monomer linear domains 207 and the PMMA monomer linear domains 208 are the same as that of the photo-resist 205 at both sides. As for the annealing, one of ordinary skill in the art can employ various suitable conditions based on common knowledge. In addition to annealing, other methods like solvent fumigation can be adopted, which is common knowledge for one of ordinary skill in the art and thus will not be described herein.

FIGS. 3a-3f illustrate another method of forming a pattern for the PS monomer linear domains 307 on the substrate 301.

Figure 3A:
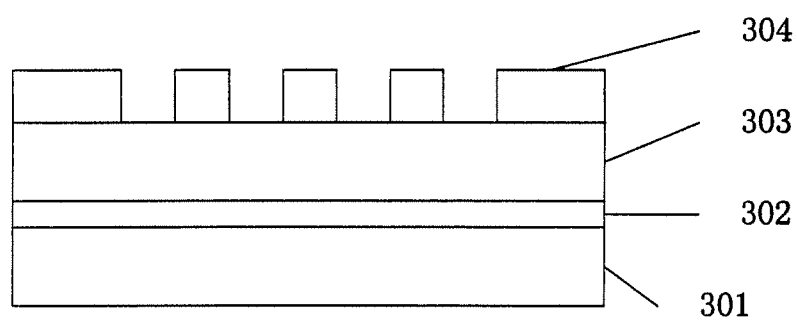
FIGS. 3a-3f are diagrams showing a second method for forming monomer patterns using block copolymers.

As shown in FIG. 3a, the photo-resist layer 303 is spin-coated on the substrate 301 having ARC/ps brush 302. Mask plate 304 is applied and then the photo-resist layer 303 is subjected to exposure using the mask plate 304.

Figure 3B:
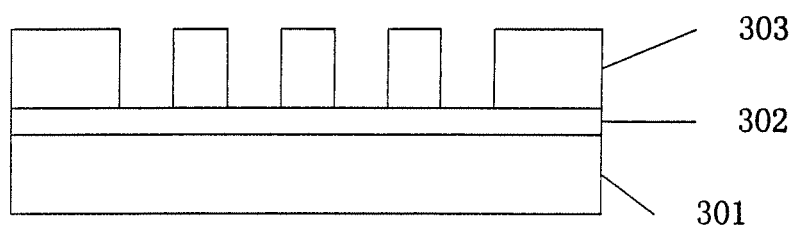

FIG. 3b shows the assembly after being subjected to the exposure. The photo-resist layer 303 is further subjected to development processing to form a photo-resist linear pattern on the substrate, such that a portion of the ARC/ps brush layer 302 is exposed.

Figure 3C:
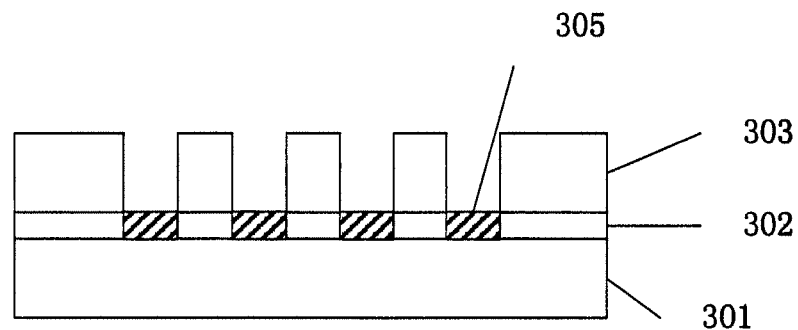

Next, as shown in FIG. 3c, the exposed ARC/ps brush layer 302 is chemically modified using, for example, oxygen plasmas.

Figure 3D:
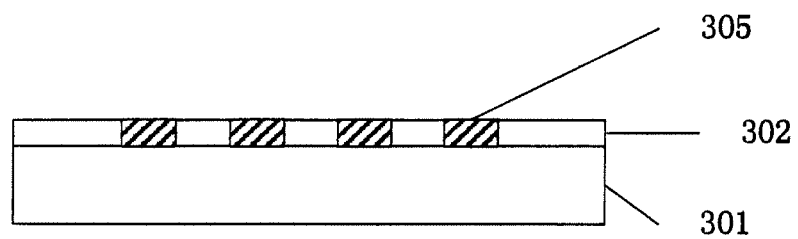

Next, as shown in FIG. 3d, the photo-resist layer 303 on the substrate is removed using a suitable solvent. Thereby a chemically patterned surface ARC/ps brush layer 302 is formed on the substrate. The linear portion 305 is chemically modified after being subjected to an oxygen plasma treatment.

Figure 3E:
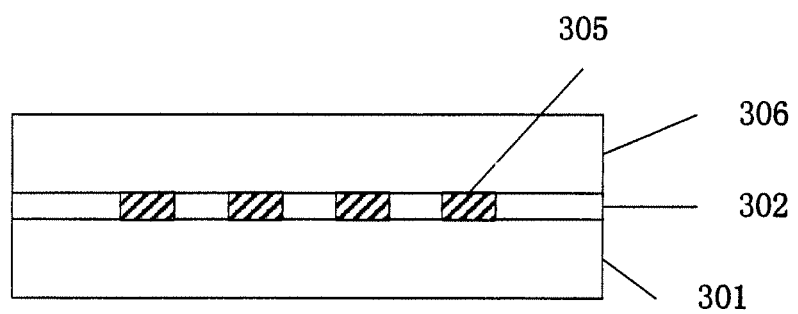

Next, as shown in FIG. 3e, the PS-b-PMMA layer 306 is spin-coated on the ARC/ps brush layer 302.

Figure 3F:
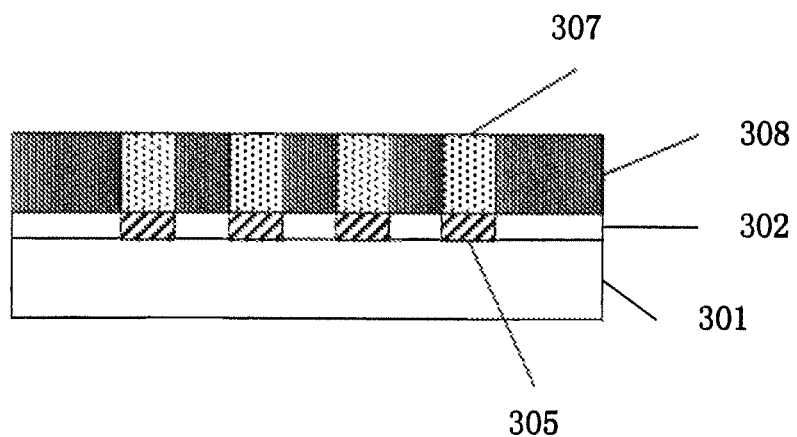

Finally, as shown in FIG. 3f, the spin-coated PS-b-PMMA layer 306 is subjected to annealing such that the PS monomer and the PMMA monomer are separated. Thereby PS monomer linear domains 307 and PMMA monomer linear domains 308 are thereby formed. Since the ARC/ps brush layer 302 has already been chemically surface patterned, the orientation and the width of the formed PS monomer linear domains 307 are the same as that of the linear portion 305 under the effect of the linear portion 305 of the ARC/ps brush layer 302.

In the pattern for the PS monomer linear blocks shown in FIGS. 2a-2d and FIGS. 3a-3f as above, the width for a monomer linear domain is typically from 10 nm to 1000 nm, which cannot meet the requirement of the critical dimension with regard to the current development of semiconductor techniques.

Next, taking PS-b-PMMA as an example, selectively depositing a metal coating on the PMMA monomer linear domains after the PS monomer and the PMMA monomer are separated through the self-assembly processing and the monomer linear domains are formed on the substrate (i.e. on the basis of FIG. 2d or FIG. 3f) are further described.

In this embodiment, metal iron is used as an example. After the formation of the PS monomer linear domains and the PMMA monomer linear domains, the target is impacted by charged particles such that iron atoms escape from the target and deposit on the surface of the block copolymer.

In this block copolymer, the PS monomer has already been separated from the PMMA monomer. Also the PS monomer linear domains and the PMMA monomer linear domains have been formed. Due to preferential chemical affinity, iron atoms selectively deposit on the surface of the PMMA monomer linear domains at an initial stage. As time goes on, the thickness of the iron layer on the PMMA domains continuously increases. When the thickness of the iron layer reaches a threshold thickness of about 2 nm, the iron layer begins to grow laterally and gradually covers the PS monomer linear domain, finally completely covering the surface of the entire block copolymer.

Figure 4A:
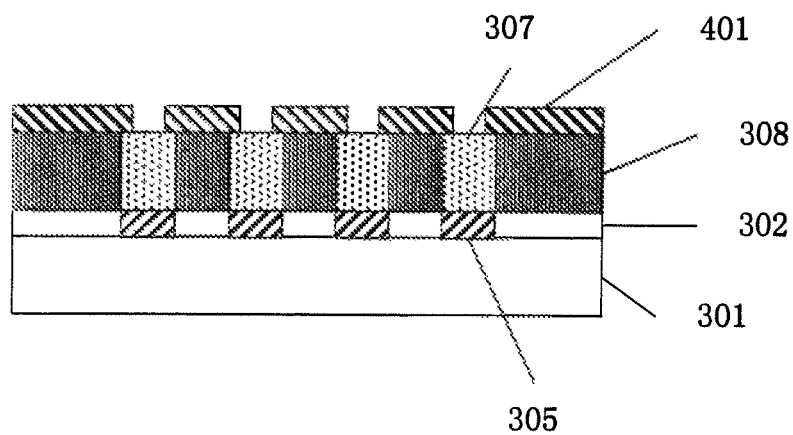
FIGS. 4a-4b are diagrams showing a method of forming a linear trench according to an embodiment of the present invention.

As shown in FIG. 4a, in this embodiment, a metal layer is further deposited. By controlling sputtering time, for example, the thickness of the iron metal layer 401 is 2 nm and begins to grow laterally. Thus, the iron layer 401 only covers a portion of the surface of the PS monomer 307 while the other portion of the surface of the PS monomer 307 has not yet being covered by the iron layer.

During the deposition of metal as mentioned above, the sputtering time depends on conditions like particle beam intensity, incident angle, target category and the distance between the target and the sample, which can be appropriately selected by one of ordinary skill in the art according to actual needs. In addition, when using other block copolymers and metal or metal nitrides, the time for depositing metals or metal nitride coatings also depends on factors such as monomer category in the block copolymers, surface affinity, and thickness of the metal or metal nitride coating to be formed. In one preferred embodiment, the deposition time for the metal or metal nitride coating can be set to a predetermined value.

As for the sputtering method, the method used can include direct current sputtering, alternative current sputtering, reactive sputtering or magnetron sputtering, which can be appropriately selected by one of ordinary skill in the art according to actual needs. One of ordinary skill in the art can also adopt other known methods to fabricate the metal layer; for example, chemical vapour deposition or electron beam evaporation.

Figure 4B:
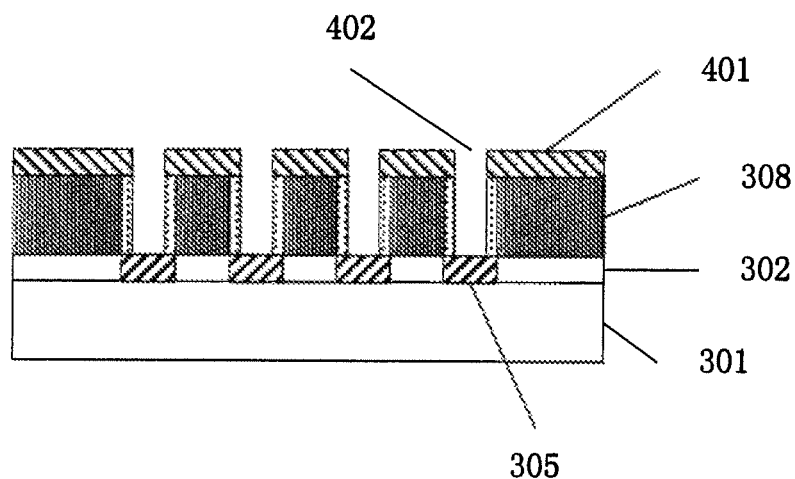

Next, by using the deposited iron layer as a mask, a dry etching is conducted to the PS monomer, so as to form the structure as shown in FIG. 4b. The PS monomer that is not covered by the iron layer 401 has already been removed by etching. Thus, a trench 402 is formed.

In the dry etching mentioned above, the etching gases employed can include, for example, Ar, $O_2$, $CF_4$ and $CHF_3$. One of ordinary skill in the art can also employ other suitable etching gases.

Further, it is understood that the present invention is not limited to dry etching. Any etching method, including wet etching, maybe used so long as it can remove the exposed PS monomer linear domains.

The widths of the PS monomer linear domains and the PMMA monomer linear domains are already relatively small and can be controlled within 10-1000 nm, for example, by controlling the mass ratio between the PS monomer and the PMMAS monomer in the PS-b-PMMA to be 10:1 to 1:10.

This embodiment further reduces the space between respective metal layers by lateral growth of the iron layers such that the trench width eventually obtained can be much smaller than the width of the PS monomer linear domains.

In the above embodiment, the trenches formed in such a manner are linear trenches. However, one of ordinary skill in the art will understand that various shapes of trenches can be formed using the method disclosed in the present invention.

Figure 5:
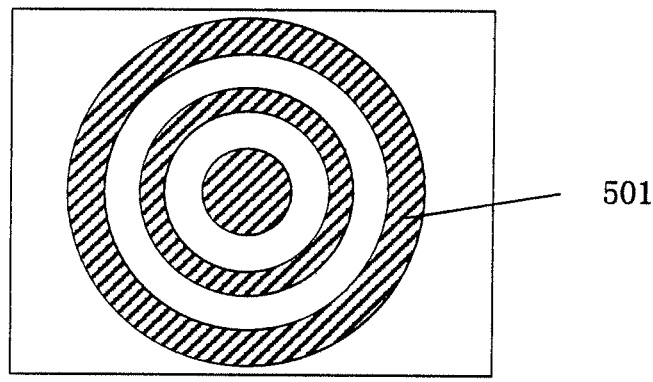
FIG. 5 is a diagram showing a method of forming a ring-shaped trench according to another embodiment of the present invention.

In another embodiment of the present invention, a ring-shaped trench is formed on the substrate. As shown in FIG. 5, an ARC/ps brush layer on the substrate is chemically surface patterned to form a ring-shaped pattern. The ring-shaped portion 501 is chemically modified by oxygen plasma treatment. Based on this, the block copolymers (e.g. PS-b-PMMA) are spin-coated on the substrate and the self-assembly processing is performed, such that a PS monomer ring-shaped pattern is obtained with the PMMA monomer as the background. In a similar manner as in the aforementioned embodiment, metal (e.g. iron) is deposited for a predetermined time and etching is conducted, and finally a ring-shaped trench is formed.

A method of forming a trench according to the present invention is described above by taking PS-b-PMMA as an example. One of ordinary skill in the art will understand that other diblock, tri-block or multi-block copolymers can be used to implement the present invention. For example, in one embodiment of the present invention, the present invention can also be implemented by using polyoxyethylene-polyoxypropylene-polyoxyethylene tri-block copolymers. In addition, if the kinds of the employed copolymers are different, the self-assembly processing performed for the block copolymers may also be different. For example, using PS-b-PMMA, the self-assembly processing adopted in the above embodiment is an annealing processing. However, one of ordinary skill in the art should understand that the PS-b-PMMA can be self assembled by other methods like solvent fumigation.

In addition, besides the deposition of metal iron, other metals such as tantalum (Ta), titanium (Ti) or the like can be used. A metal nitride can be used to replace the metal, such as titanium nitride (TiN) or tantalum nitride (TaN). The properties of these metal nitrides are similar as that of the metal and these metallic nitrides likewise can preferentially deposit on the PMMA monomer linear domains during the deposition process.

The methods of forming a trench according to the present invention as well as a semiconductor device formed thereby has been described in detail. In order to not obscure the concepts of the invention, some details known in the art are not described. However, one of ordinary skill in the art based on the teachings herein will understand how to implement the technical solutions disclosed herein based on the above description.

Although some specific embodiments of the present invention have been demonstrated in detail with examples, is understood by a person skilled in the art that the above examples are only intended to be illustrative and not to limit the scope of the present invention. It is also understood by a person skilled in the art that the above embodiments can be modified without departing from the scope and spirit of the present invention. The scope of the present invention is defined by the attached claims.

What is claimed is:

1. A method of manufacturing a semiconductor device, comprising the steps of:
    performing a self-assembly process for a coating of block copolymer that is copolymerized by two or more types of monomers, such that at least one monomer in said block copolymer is self-assembled, so as to form a pattern for said at least one monomer;

depositing a metal or a metal nitride coating on a planar surface of said block copolymer and forming the metal or metallic nitride coating only on the planar surface of one of said at least one monomer due to preferential chemical affinity, wherein when the deposited metal or metal nitride coating commences lateral growth so as to cover other surface portions of said block copolymer, continue depositing the metal or metallic nitride coating but cease said depositing and said lateral growth before the entire surface of said block copolymer is completely covered; and etching, by using the deposited metal or metal nitride coating as a mask, to remove a portion of the block copolymer that is not covered by the deposited metal or metal nitride coating, thereby forming a trench.

2. The method of claim 1, wherein said block copolymer is a diblock copolymer.

3. The method of claim 2, wherein said diblock copolymer is a polystyrene-block-poly (methyl methacrylate) copolymer.

4. The method of claim 3, wherein the mass ratio of polystyrene monomer and poly (methyl methacrylate) monomer is from 10:1 to 1:10 in said polystyrene-block-poly (methyl methacrylate) copolymer.

5. The method of claim 1, wherein said block copolymer is a tri-block copolymer.

6. The method of claim 5, wherein said tri-block copolymer is a polyoxyethylene-polyoxypropylene-polyoxyethylene tri-block copolymer.

7. The method of claim 1, wherein said self-assembly process is solvent fumigation or annealing.

8. The method of claim 1, wherein said metal is iron, tantalum or titanium, and said metal nitride is titanium nitride or tantalum nitride.

9. The method of claim 1, wherein said etching is a dry etching.

10. The method of claim 9, wherein the gas used in said dry etching comprises Ar, $O_2$, $CF_4$ or $CHF_3$.

11. The method of claim 1, wherein a width of the pattern for said at least one monomer is controlled by adjusting the mass ratio of each monomer in said block copolymer.

12. The method of claim 1, wherein said metal coating is deposited by sputtering, chemical vapour deposition or electron beam evaporation.

13. The method of claim 12, wherein said sputtering is direct current sputtering, alternative current sputtering, reactive sputtering or magnetron sputtering.

14. The method of claim 1, wherein a time for depositing said metal coating is set to a predetermined value.

15. The method of claim 1, wherein the pattern for said monomer is a linear pattern or a ring-shaped pattern.

16. The method of claim 1, wherein said block copolymer coating is applied to a semiconductor substrate.

* * * * *